(12) United States Patent
Guo et al.

(10) Patent No.: US 9,819,357 B1
(45) Date of Patent: Nov. 14, 2017

(54) CURRENT REMOVAL FOR DIGITAL-TO-ANALOG CONVERTERS

(71) Applicant: QUALCOMM Incorporated, San Diego, CA (US)

(72) Inventors: Wei Guo, San Diego, CA (US); Sang Min Lee, San Diego, CA (US); Behnam Sedighi, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/593,081

(22) Filed: May 11, 2017

(51) Int. Cl.
    *H03M 1/78* (2006.01)
    *H03M 1/00* (2006.01)
    *H03M 1/74* (2006.01)

(52) U.S. Cl.
    CPC ............. *H03M 1/785* (2013.01); *H03M 1/00* (2013.01); *H03M 1/747* (2013.01)

(58) Field of Classification Search
    CPC ......... H03M 1/785; H03M 1/747; H03M 1/00
    USPC .................. 341/154, 144, 145, 153
    See application file for complete search history.

(56) References Cited

U.S. PATENT DOCUMENTS

| | | | |
|---|---|---|---|
| 6,448,917 B1 * | 9/2002 | Leung | ................ H03M 1/0663 341/144 |
| 6,778,113 B2 | 8/2004 | Xu et al. | |
| 6,924,761 B2 | 8/2005 | Jiang et al. | |
| 8,803,722 B2 | 8/2014 | Iadanza | |
| 8,912,939 B2 | 12/2014 | Dempsey | |
| 9,531,337 B2 | 12/2016 | Chen et al. | |

* cited by examiner

Primary Examiner — Joseph Lauture
(74) Attorney, Agent, or Firm — Colby Nipper/Qualcomm

(57) ABSTRACT

The present disclosure describes aspects of current removal for digital-to-analog converters (DACs). In some aspects, a circuit for converting a digital input to an analog output includes a first resistor ladder having first resistors connectable to respective current sources and connected to a first output of the circuit. The circuit also includes second resistor ladder having second resistors connectable to the respective current sources and connected to a second output of the circuit. A common node is formed between common resistor terminals of the first resistor ladder and the second resistor ladder. Current removal circuitry is connected to the common node and referenced to an amount of current provided by the respective current sources. By removing current from the common node of the resistor ladders, common-mode current at outputs of the circuit can be reduced with minimal degradation of differential performance of the circuit.

30 Claims, 10 Drawing Sheets

CURRENT REMOVAL FOR DIGITAL-TO-ANALOG CONVERTERS

BACKGROUND

Field of the Disclosure

This disclosure relates generally to digital-to-analog converters (DACs), more specifically to current steering DACs.

Description of Related Art

This description of related art is provided for the purpose of generally presenting a context for the disclosure that follows. Unless indicated otherwise herein, concepts described in this section are not prior art to this disclosure and are not admitted to be prior art by inclusion herein.

Many electronic devices include a transceiver that enables communication of data over a wireless network or link (e.g., peer-to-peer connection). These transceivers often include a digital-to-analog converter (DAC) to implement various signal processing operations, such as complex digital modulation. In some cases, the DAC is implemented as a differential DAC with an output that includes a positive output leg and a negative output leg. During operation, a differential DAC may develop excess current on both legs of the output that degrades DAC performance or other downstream signal processing operations. To address this issue, a compensation circuit is typically implemented to sink this excess current directly from each of the positive and negative legs of the differential DAC output. Attempting to sink this current directly from each of the differential legs, however, can degrade differential noise levels of the DAC and affect transceiver performance.

SUMMARY

In some aspects of current removal for digital-to-analog converters (DACs), a circuit for converting a digital input to an analog output includes a first resistor ladder having first resistors connectable to respective current sources and connected to a first output of the circuit. The circuit also includes second resistor ladder having second resistors connectable to the respective current sources and connected to a second output of the circuit. Based on a digital input to the circuit, different ones of the first and second resistors are connected to the respective current sources to provide an analog signal at the first and second outputs of the circuit.

A common node of the circuit is formed between common terminals of the first resistors of the first resistor ladder and second resistors of the second resistor ladder. Circuitry configured to remove (e.g., sink) current is connected to the common node of the circuit and referenced to an amount of current provided by one of the respective current sources. By removing current from the common node of the circuit, common-mode current at outputs of the circuit can be reduced with minimal degradation of differential performance of the circuit.

The foregoing summary is provided to briefly introduce some of the aspects described herein. This summary is not intended to identify key or essential features of these or other aspects that are further described throughout the disclosure.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Figure 1:
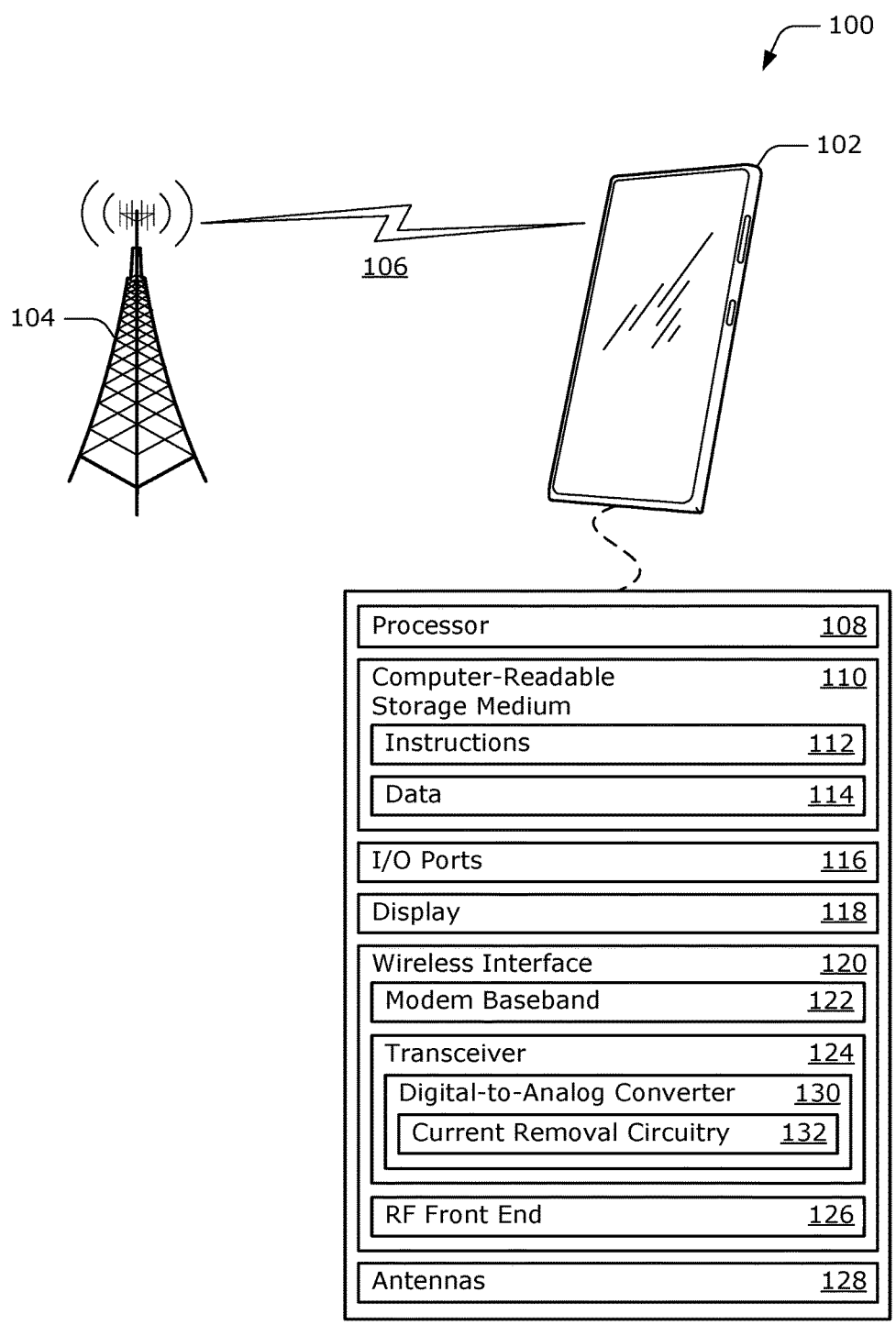
FIG. 1 illustrates an example environment that includes a computing device capable of wireless communication.

Conventionally implemented digital-to-analog converter (DAC) circuits typically include a current feedback circuit to remove current directly from an output of the DAC circuit. For example, a conventional current steering DAC, such as resistor two-resistor (R-2R) DAC, may implement a split resistor dump path for excess current of R-2R resistor ladders. This dump path is often implemented with a voltage buffer referenced to a common-mode output voltage to manage current flow and common-mode current is sank directly from differential outputs of the circuit. Attempting to sink the common-mode current only at the outputs of the circuit, however, degrades differential noise levels and other performance characteristics of a DAC.

Additionally, differences between the voltage buffer of the dump path and the common-mode output voltage can cause further variation of common-mode current at the outputs of the DAC. The voltage buffer also requires connection or access to a reference voltage, which may not be available on-chip or in-circuit, thus increasing design complexity and interconnect requirements of a DAC chip. Further, the voltage buffered dump path introduces a current-resistance (IR) voltage drop that reduces voltage headroom for corresponding current sources of the DAC. As such, conventional DAC circuits are unable to address common-mode current issues without degrading performance of the DAC or increasing DAC complexity and interconnect requirements.

In aspects of current removal for DACs, a circuit includes two resistor sections (e.g., resistor ladders) connected to respective outputs of the circuit and to each other at a common node. The circuit also includes a current sink or amplifier connected to the common node that is configured to remove current from the two resistor sections of the circuit. By so doing, the common-mode current on differential outputs of a DAC can be reduced, thereby improving DAC performance with minimal degradation to differential signal performance (e.g., differential noise) of the DAC.

For current steering DACs, such as resistor two-resistor (R-2R) DACs, at least some of the common-mode current can be removed from a midpoint of the R-2R resistor ladders by replacing a voltage buffered dump path with a current mirror or amplifier with resistor feedback. The current mirror or amplifier may adaptively remove as much of the common-mode current from the resistor sections as possible, which in turn reduces an amount of the common-mode current flowing out to the differential outputs of the DAC. Subsequent removal of the reduced common-mode current at the output of the DAC requires less compensation or correction, resulting in improved differential noise performance. A DAC implemented with this current removal circuitry is also less complex because the DAC no longer relies on a voltage buffer that requires access to an external reference voltage for the voltage buffer.

Further, as noted above, conventional DACs may suffer from IR voltage drop across resistors of the DAC. This voltage drop is caused by a majority of current provided by a current source flowing through the resistors to an output of the DAC, which consumes voltage headroom of the corresponding current source. By sinking current at a middle point of R-2R resistor ladders, as described herein, an amount of current flowing through the R-2R resistor ladder to a DAC output can be reduced. This in turn reduces IR voltage drop across the R-2R ladder, resulting in improved voltage headroom for the current sources and better DAC performance.

These and other aspects of current removal for DACs are described below in the context of an example environment, example current removal circuits, and various techniques. Any reference made with respect to the example environment or circuit, or elements thereof, is by way of example only and is not intended to limit any of the aspects described in this disclosure.

Example Environment

FIG. 1 illustrates an example environment 100, which includes a computing device 102 that communicates with a base station 104 through a wireless communication link 106 (wireless link 106). In this example, the computing device 102 is implemented as a smart-phone. Although not shown, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and the like.

The base station 104 communicates with the computing device 102 via the wireless link 106, which may be implemented as any suitable type of wireless link. Although shown as a base station, the base station 104 may represent or be implemented as another device, such as a satellite, cable television head-end, terrestrial television broadcast tower, access point, peer-to-peer device, mesh network node, fiber optic line, and the like. Therefore, the computing device 102 may communicate with the base station 104 or another device, via a wired connection, wireless connection, or a combination thereof.

The wireless link 106 may include a downlink of data and control information communicated from the base station 104 to the computing device 102 and an uplink of other data and control information communicated from the computing device 102 to the base station 104. The wireless link 106 can be implemented using any suitable communication protocol or standard, such as 3rd Generation Partnership Project Long-Term Evolution (3GPP LTE), IEEE 802.11, IEEE 802.16, Bluetooth™, and the like.

The computing device 102 includes a processor 108 and computer-readable storage medium 110 (CRM 110). The processor 108 may include any type of processor, such as an application processor or multi-core processor, configured to execute processor-executable code stored by the computer-readable storage medium 110. The CRM 110 may include any suitable type of data storage media, such as non-volatile memory (e.g., Flash memory), optical media, magnetic media, and the like. In the context of this disclosure, the CRM 110 is implemented to store instructions 112, data 114, and other information of the computing device 102, and thus does not include transitory propagating signals or carrier waves.

The computing device 102 also includes input/output ports 116 (I/O ports 116) and a display 118. The I/O ports 116 enable data exchanges or interaction with other devices, networks, or users. The I/O ports 116 may include serial ports (e.g., universal serial bus ports), parallel ports, audio ports, infrared ports, and the like. The display 118 of the computing device 102 may present graphical content, such as a user interface associated with an operating system, program, or application. Alternately or additionally, the display 118 may be implemented as a display port or virtual interface, through which the graphical content of the computing device 102 is presented.

A wireless interface 120 of the computing device 102 provides connectivity to respective networks and peer devices via a wireless link, which may be configured similar to or differently from the wireless link 106. Alternately or additionally, the computing device 102 may include a wired transceiver, such as an Ethernet or fiber optic interface for communicating over a local network, intranet, or the Internet. The wireless interface 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the computing device 102 communicates various data and control information with the base station 104 through the wireless interface 120.

The wireless interface 120 includes a modem baseband 122, transceiver 124, and RF front end 126 to process data and/or signals associated with communicating data of the computing device 102 over antenna 128. The modem baseband 122 may be implemented as a system-on-chip (SoC) that provides a digital communication interface for data, voice, messaging, and other applications of the computing device 102. The modem baseband 122 includes a digital signal processor or signal processing blocks for encoding and modulating data for transmission, or demodulating and decoding received data. Additionally, the modem baseband 122 may also manage (e.g., control or configure) the transceiver 124, RF front end 126, and other components of the wireless interface 120 to implement various communication protocols or communication techniques.

The transceiver 124 includes circuitry and logic for filtering, amplification, and frequency translation, which may be an up-conversion or down-conversion, performed in a single conversion, or through a plurality of conversion steps. The transceiver 124 also includes a digital-to-analog converter 130 (DAC 130) to convert digital values to an analog signals and current removal circuitry 132. The DAC 130 may be implemented as any suitable type of DAC, such as a single-ended DAC, current steering DAC, differential DAC, segmented DAC, and the like. The implementation and use of the current removal circuitry 132 varies, and is described throughout the disclosure. Although not shown, the transceiver 124 may also include an analog-to-digital converter to convert analog signals to digital values.

The components or circuitry of the transceiver 124 can be implemented in any suitable fashion, such as combined transceiver logic or separately as respective receiver and transceiver entities. In some cases, the transceiver 124 is implemented with multiple or different sections to implement respective receiving and transmitting operations (e.g., transmit and receive chains). The transceiver 124 may also include logic to perform in-phase/quadrature (I/Q) operations, such as synthesis, encoding, modulation, decoding, demodulation, and the like.

The RF front end 126 includes filters, switches, and amplifiers for conditioning signals received via the antenna 128 or signals to be transmitted via the antenna 128. The RF front end 126 may also include other RF sensors and components, such as a peak detector, power meter, gain control block, antenna tuning circuit, balun, and the like. Configurable components of the RF front end 126 may be controlled by the modem baseband 122 to implement communications in different modes or frequency bands.

Figure 2:
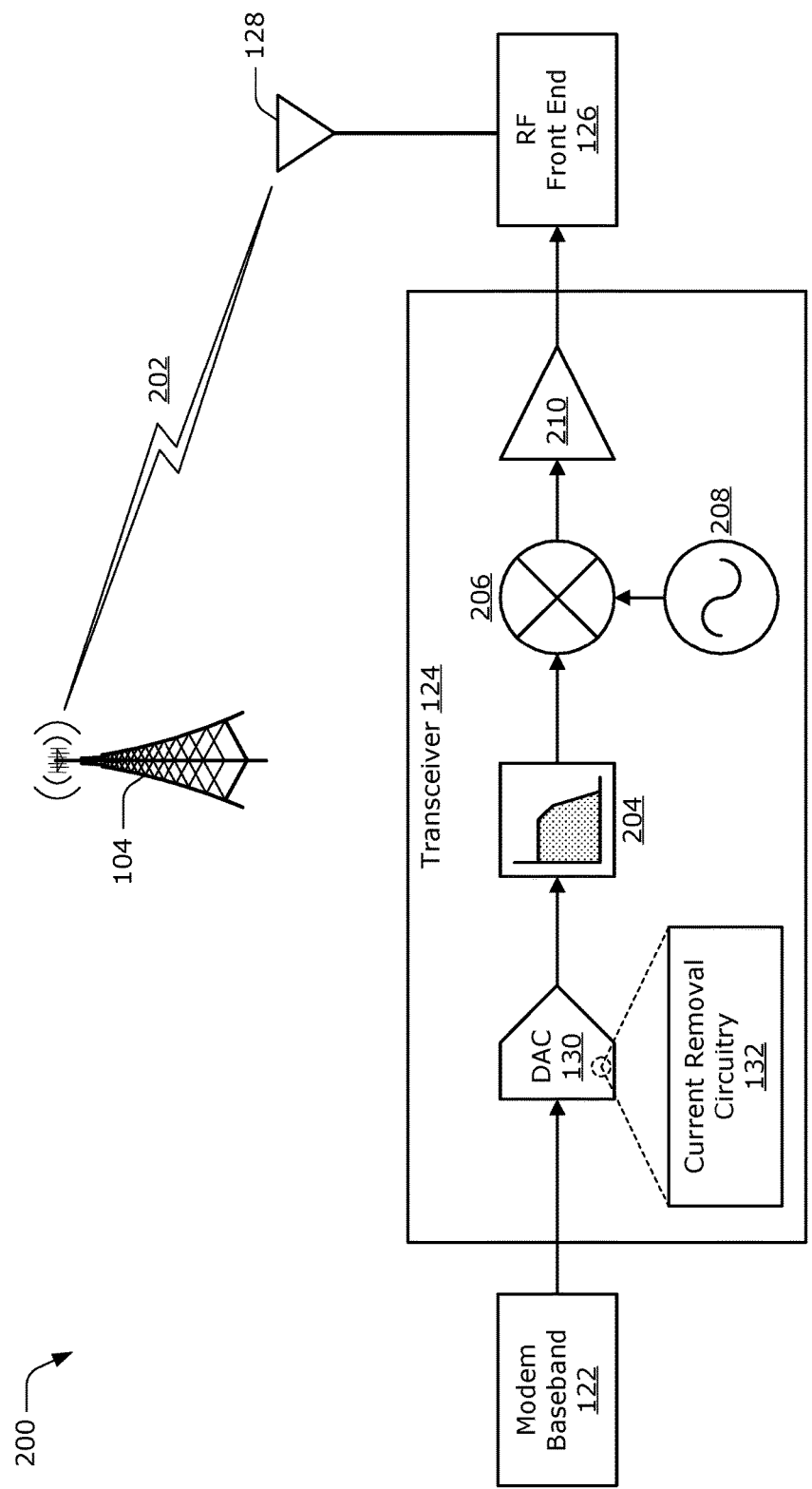
FIG. 2 illustrates an example configuration of a transceiver of a wireless interface.

FIG. 2 illustrates an example configuration of the wireless interface 120 generally at 200. In this particular example, the wireless interface 120 is transmitting, via antenna 128, an RF signal 202 to the base station 104. The entities shown in FIG. 2 may be configured as a transmit chain or transmit path of the wireless interface 120. Although not shown, the wireless interface 120 may include a receive chain or receive path capable of performing complimentary operations to process received RF signals. The RF signal 202 may be communicated in accordance with any suitable communication protocol or standard, and may represent an uplink portion of the wireless link 106 as described with reference to FIG. 1.

Generally, the modem baseband 122 encodes and modulates data of the wireless interface 120 to be transmitted and provides the modulated data to the DAC 130. The DAC 130 converts the modulated data provided by the modem baseband 122 from a digital input signal to an analog output signal. The DAC 130 may be configured to receive digital values of any suitable size for conversion, such as values ranging from 8-bits to 20-bits in size. In this example, the DAC 130 is implemented as a differential DAC and includes an instance of current removal circuitry 132. The current removal circuitry 132 can be configured to sink current from a resistor network or resistor section of the DAC 130 effective to reduce an amount of common-mode current flowing on differential outputs of the DAC with minimal compromise of differential noise performance of the DAC.

The analog signal output by the DAC 130 is then provided to a baseband filter 204 of the transceiver 124. The baseband filter 204, shown here as a low-pass filter, filters the analog signal output by the DAC 130 to remove high frequency artifacts or images introduced by the digital-to-analog conversion operations of the DAC 130. A mixer 206 of the transceiver 124 receives the filtered signal from the baseband filter 204 and a clock signal from a local oscillator 208. Based on the clock signal, the mixer 206 up-converts the filtered signal to provide an RF signal to a driver amplifier 210.

The driver amplifier 210 amplifies the up-converted RF signal and transmits the amplified RF signal to the RF front end 126 for subsequent filtering or amplification via power amplifiers. Once amplified to a sufficient power level for transmission, the RF signal is routed by switches of the RF front end 126 to the antenna 128 for over-the-air transmission to the base station 104. This is but one example configuration of a transceiver that includes a DAC 130 and current removal circuitry 132. The DAC 130 and current removal circuitry 132 may be implemented in any suitable transceiver configuration or within another component of the wireless interface 120, such as the modem baseband 122.

Figure 3:
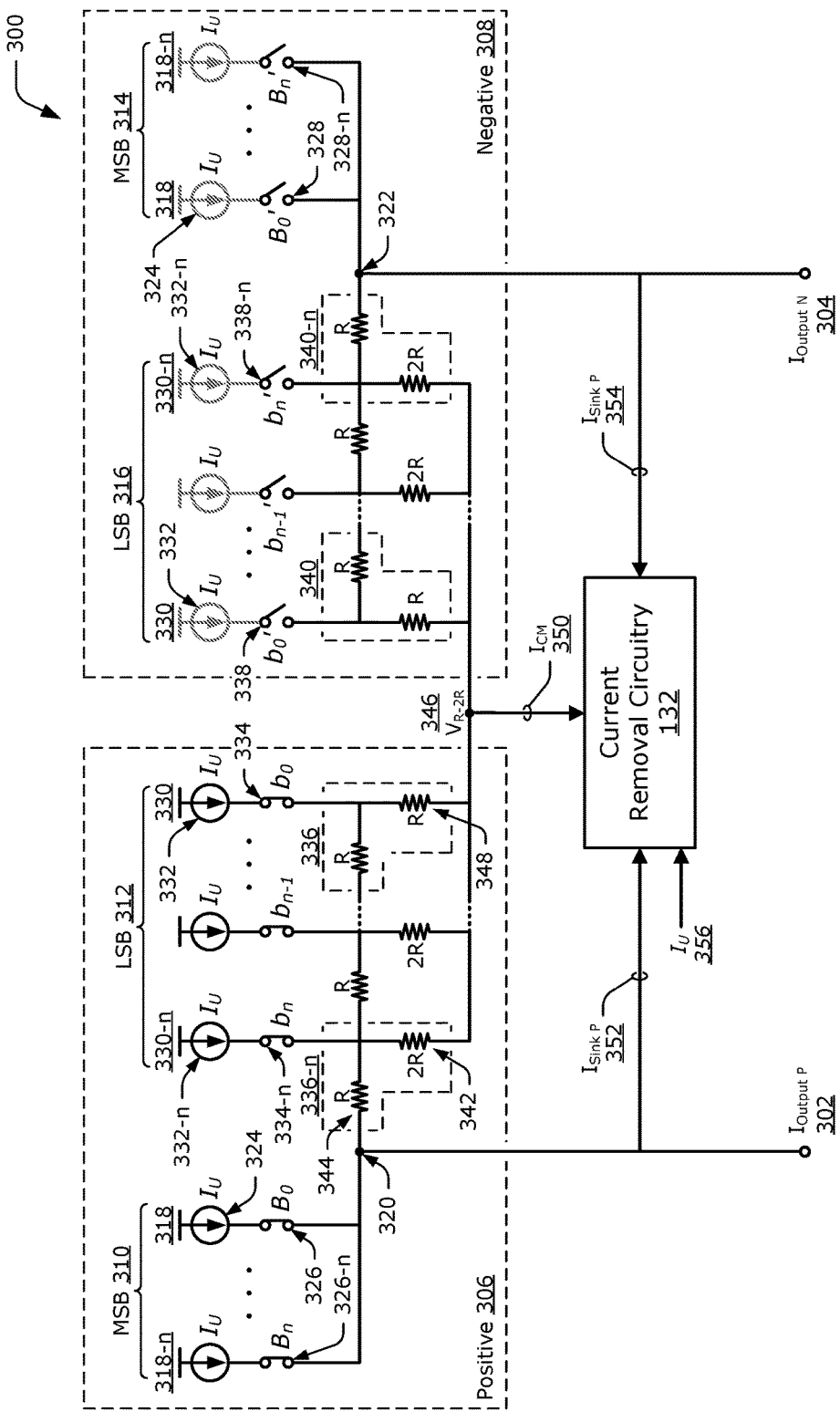
FIG. 3 illustrates an example differential digital-to-analog converter (DAC) circuit that includes circuitry for current removal.

FIG. 3 illustrates an example digital-to-analog converter circuit 300 (DAC circuit 300), which is configured as a current steering DAC that includes an instance of current removal circuitry 132. In this example, outputs of the DAC circuit 300 are configured as complementary current source outputs that include a positive current output 302 ($I_{Output\ P}$ 302) and a negative current output 304 ($I_{Output\ N}$ 304). The DAC circuit 300 may also be referred to as a current steering DAC in which a particular or fixed amount of current is steered between the two differential DAC outputs based on a digital code or value provided to inputs of the DAC or associated decoder circuit. Conceptually, this DAC structure can be characterized as two current source outputs having a direct current (DC) current of approximately one half of a total or maximum reference current (e.g., full scale current) over which a differential current signal is imposed by current steering.

For visual clarity, a positive current branch 306 and a negative current branch 308 of the DAC circuit 300 are shown separately in FIG. 3. Although shown as separate sections with individual or discrete elements, the positive current branch 306 and negative current branch 308 may share common elements, such as current sources that can be implemented as a single current source with switches to steer current to or through either section. To illustrate this, the shared current sources are illustrated in both positive and negative sections of the circuit, with those in the negative branch shown as partially transparent. The DAC circuit 300 may be configured to convert any suitable digital input code or value to an analog output signal. For example, the DAC circuit may be configured as an 11-bit, 12-bit, 13-bit, or 14-bit DAC with a homogenous or heterogeneous current structures. Alternately or additionally, the DAC circuit 300 can include decoding logic or decoding circuitry (not shown) to receive, decode, or apply a digital input to control elements (e.g., switches) of the DAC circuit.

In this example, the DAC circuit 300 is implemented as a segmented DAC that includes separate sections that steer current to the positive current output 302 or the negative current output 304 based on most significant bits (MSBs) of a digital value and least significant bits (LSBs) of the digital value, respectively. To do so, the positive current branch 306 of the DAC circuit 300 includes an MSB portion 310 configured to steer current based on MSB-based values and an LSB portion 312 configured to steer current based on LSB-based values. Generally, a decoder associated with the DAC circuit 300 thermo-decodes (e.g., binary-to-thermometer decode) an MSB part of the digital value to provide thermo-coded bit values $B_0$ through $B_N$ to control the MSB portion 310, where N is any suitable integer. Similarly, the decoder can decode an LSB part of the digital value to provide binary-weighted bit values $b_0$ through $b_n$ to control the LSB portion 312, where n is any suitable integer.

The negative current branch 308 of the DAC circuit 300 also includes an MSB portion 314 configured to steer current to the negative current branch 308 based on complimentary MSB thermo-coded bit values $B_0'$ through $B_N'$ and an LSB portion 316 configured to steer current based on complimentary binary-weighted bit values $b_0'$ through $b_n'$. For example, when configured as a 15-bit DAC, a 15-bit digital input value (e.g., [14:0]) can be divided and decoded into seven thermo-coded bit values (e.g., [14:8]) for the MSB portions 310 and 314, and eight binary-weighted bit values (e.g., [7:0]) for the LSB portions 312 and 316.

The MSB portions 310 and 314 of the DAC circuit 300 may include multiple stages 318 through 318-$n$ that provide and steer current to a current summing node 320 of the positive current branch 306 or a current summing node 322 of the negative current branch 308. With reference to stage 318, each of the MSB stages 318 through 318-$n$ includes a unit current source 324 configured to provides a unit amount of current ($I_U$), a first switch 326 to steer the unit amount of current to the positive current summing node 320, and a second switch 328 to steer the unit amount of current to the negative current summing node 322. Although referred to as unit amount of current, the current provided by a unit current source may also be referred to as an MSB amount of current ($I_{MSB}$) because each bit of the MSB value may steer this amount of current to the outputs of the DAC circuit 300. Generally, the MSB portion of a digital input value can be fully decoded into individual bits (e.g., $B_0$ through $B_N$) that control switches 326 through 326-$n$ and individual complimentary bits $B_0'$ through $B_N'$ that control switches 328 through 328-$n$ to steer current to respective outputs of the DAC.

The LSB portions 312 and 316 of the DAC circuit 300 include multiple stages 330 through 330-$n$ that also provide and steer current to the positive current summing node 320 or the negative current summing node 322. With reference to stage 330, each of the LSB stages 330 through 330-$n$ includes a unit current source 332 configured to provides a unit amount of current ($I_U$), a first switch 334 to steer the unit amount of current to a resistor network 336 of the positive current branch 306, and a second switch 338 to steer the unit amount of current to a resistor network 340 of the negative current branch 308. Generally, the LSB portion of a digital input value can be decoded into individual bits (e.g., $b_0$ through $b_N$) that control switches 334 through 334-$n$ and individual complimentary bits $b_0'$ through $b_N'$ that control switches 338 through 338-$n$ to steer current to respective resistor networks.

The resistor networks of the DAC circuit 300 enable scaling or partitioning of the current provided by the unit current sources 332 through 332-$n$ based on values of LSB input bits (e.g., $b_0$ through $b_N$). The resistor networks may be configured with any suitable number of resistors with same, scaled, or different values. In some aspects, the resistor networks 336 through 336-$n$ and 340 through 340-$n$ are configured as resistor ladders formed between an LSB portion of a DAC circuit and respective current summing node. In this particular example, the resistor networks 336 through 336-$n$ and 340 through 340-$n$ are configured as respective resistor two-resistor (R-2R) ladders in the LSB portions 312 and 316 of the DAC circuit 300.

With reference to resistor network 336-$n$, the resistor network associated with a most significant bit ($b_n$) of the LSB bit value and connected to the positive current summing node 320, each of the resistor networks 336 through 336-$n$ may include a first resistor 342 and second resistor 344. The first resistor 342 is connected between a switch 334-$n$ (or a current source 332-$n$) of the stage and a common node of the resistor network. The common nodes of the respective resistor ladders may be connected to form a node at which common-mode current or voltage of the resistor ladders $V_{R-2R}$ 346 is present. The second resistor 344 connects a terminal of the first resistor 342 to another resistor network or to the positive current summing node 320. The resistor networks 340 through 340-$n$ may be configured similarly as shown in FIG. 3, with the resistor network 340-$n$ connected to the negative current summing node 322.

Generally, resistor values of each R-2R network include a resistor of a first value (e.g., R) and another value that is twice that of the first (e.g., 2R) as implied by the naming convention. This allows an R-2R resistor ladder to be scaled for any suitable number of n stages (or parallel stages) in which each stage contributes a scaled amount of current. Here, note that a first resistor 348 of the resistor network 336 may have a same value as another resistor of the network where the resistor network terminates.

Whereas each MSB stage of the DAC circuit 300 steers a unit amount of current, each LSB stage connected to the R-2R resistor ladders can steer a scaled or weighted portion of the unit amount of current to an output. For example, working from resistor network 336-$n$ to resistor network 336, each stage 330-$n$ through 330 steers, through the resistor ladder to an output, a fraction of unit current that is approximately half of a preceding stage. Specifically, folding down the R-2R ladder via Thevenin equivalents, stage 330-$n$ may steer approximately one half $I_U$, a next stage (e.g., $b_{n-1}$) may steer one quarter $I_U$, and so on, with a last stage 330 (e.g., $b_n$) steering a fraction of $I_U$ that is approximately $I_U$ divided by $2^n$ (where n is a number LSB bits or stages).

To achieve this current flow through an R-2R ladder, conventional DACs often include a voltage buffer to hold a common ladder node at an approximate common-mode output voltage ($V_{CM}$) of the DAC. Thus, any variation in the common ladder node and $V_{CM}$ at the DAC output can cause common-mode current to flow on the differential DAC outputs. Typically, this common-mode current is removed only from each differential output of the DAC, which degrades differential noise performance.

In aspects of current removal for DACs, however, current removal circuitry 132 can be implemented to remove common-mode current 350 from the common node $V_{R-2R}$ 346 thereby minimizing an amount of common-mode current at outputs 302 and 304 of the DAC circuit 300. In some cases, the current removal circuitry 132 removes (or sinks) the common-mode current 350 and respective sink currents ($I_{SINK}$) 352 and 354 from the positive output 302 and negative output 304 of the DAC. The current removal circuitry 132 may also receive or be referenced to a unit amount of current 356 or an amount of MSB current $I_{MSB}$. Alternately or additionally, the current removal circuitry 132 can be referenced to a scaled version of a unit amount of current or a digital representation of the unit amount of current. The implementation and use of the current removal circuitry 132 varies, and is described throughout the disclosure.

Figure 4:
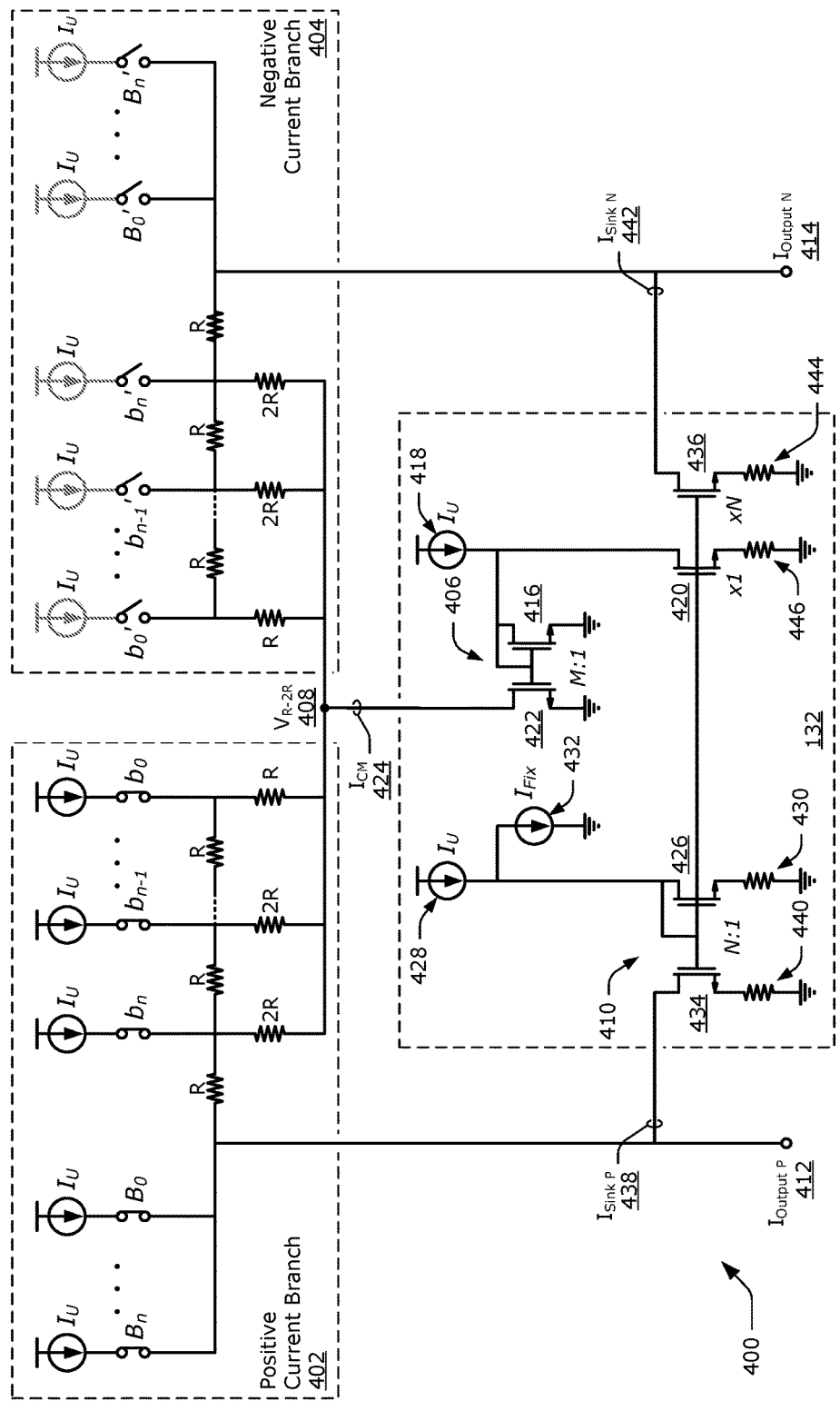
FIG. 4 illustrates an example DAC circuit that includes a current mirror implemented in accordance with one or more aspects.

FIG. 4 illustrates an example DAC circuit 400 that includes current removal circuitry implemented with current mirrors. The DAC circuit 400 may be configured as any suitable type of DAC circuit, such as the DAC circuit 300 described with reference to FIG. 3. For visual brevity, here assume that a positive current branch 402 and negative current branch 404 of the DAC circuit are configured similar to those of the DAC circuit 300 with respective MSB and LSB portions of current steering stages and R-2R resistor networks. As such, a digital input of the DAC circuit 400 can be partitioned into respective MSB and LSB parts, which are then thermo-decoded into bit values $B_0$ through $B_N$ to control the MSB portion and binary-weighted bit values $b_0$ through $b_n$ to control the LSB portion.

In this example, the DAC circuit 400 includes an instance of current removal circuitry 132 that is configured with current mirrors. The current removal circuitry 132 includes a first current mirror 406 connected to a common node 408 of the R-2R resistor ladders and a second current mirror 410 connected to a positive current output 412 and negative current output 414 of the DAC circuit 400. Although shown as implemented with two current mirrors, the current removal circuitry may be implemented with any suitable number or configuration of current mirrors, current sinks, or current sources.

The first current mirror 406 includes a gate-drain coupled transistor 416 that is connected to a unit current source 418, which may be configured similar to unit current sources or MSB current sources of the DAC circuit 400. An output of the unit current source 418 is also connected to a drain of a transistor 420 of the second current mirror 410. As such, the first current mirror 406 may be referenced to a difference between the unit amount of current and an amount of current sank or drawn by the transistor 420 of the second current mirror 410. A transistor 422 of the first current mirror includes a drain connected to the common node 408 and is configured to sink common mode-current 424 ($I_{CM}$ 424) from the R-2R sections based on current of the gate-drain coupled transistor 416.

The second current mirror 410 includes a gate-drain coupled transistor 426 having a drain connected to a unit current source 428 and a source connected to a lower potential via a resistor 430. The circuitry may also include a current sink 432 (or current source) configured to sink a fixed or variable amount of current to a lower potential. This current sink 432 can be connected to the unit current source 428 such that the second current mirror 410 is referenced to a difference in current between the unit current source 428 and the current sink 432. Further, when an amount of current sank by the current sink 432 exceeds the unit amount of current, the second current mirror 410 may not receive reference current to operate and may cease to operate until the reference current increases.

A pair of transistors 434 and 436 of the second current mirror 410 are connected to the positive current output 412 and negative current output 414, respectively. The transistor 434 is configurable to sink an amount of positive sink current 438 ($I_{SINK}$ 438) through a resistor 440 based on current flowing through the gate-drain coupled transistor 426. Similarly, the transistor 436 is also configurable to sink an amount of negative sink current 442 ($I_{Sink\ N}$ 442) through a resistor 444 based on the current flowing through the gate-drain coupled transistor 426. As noted, the transistor 420 is connected to the unit current source 418 and is also configurable to sink current through a resistor 446 based on the current of the gate-drain coupled transistor 426. Although shown with resistors 430, 440, 444, and 446, the DAC circuit 400 can be implemented without any or all of these resistors, which do not affect functionality of the current removal circuitry.

The first and second current mirrors 406 and 410 of the current removal circuitry 132 may be configurable in various ways to sink current from the DAC circuit 400. The current mirrors 406 and 410 may be configured based on any suitable parameter or property of a DAC, such as a number of stages, number of current sources, or an amount of current steered by the DAC circuit 400. For example, the transistors 416 and 422 of the first current mirror 406 can be scaled by varying device size (or number) such that the transistor 422 sinks a multiple (M:1) of the unit amount of current or current difference at the drain of the gate-drain coupled transistor 416. Alternately or additionally, the transistors 434 and 436 of the second current mirror can be scaled by varying device size (or number) to sink a multiple (N:1) of the amount of current in the gate-drain coupled transistor 426. In some cases, the ratio of the first current mirror (M:1) is selected such that M equals a number of MSB stages of a DAC and the ration of the second current mirror (N:1) is selected such that N equals half the number of MSB stages of the DAC. Thus, the current removal circuitry 132 can be configured and fabricated for a particular DAC configuration to remove a maximum amount of common-mode current from a common node of the resistor ladders.

In some aspects, reference current of the first current mirror 406 or the second current mirror 410 may adjust or vary based on operation of the DAC circuit 400. For example, as full scale current or unit amount of current of the DAC circuit 400 varies, the fixed amount of current sank by the current sink 432 affects the reference current of the second current mirror 410. This in turn, via the transistor 420 connected to the unit current source 418, may also affect the reference current of the first current mirror 406. As such, the current removal circuitry 132 may adaptively adjust respective amounts of $I_{CM}$ 424, $I_{Sink\ P}$ 438, and $I_{Sink\ N}$ 442 sank from the DAC circuit 400.

Figure 5:
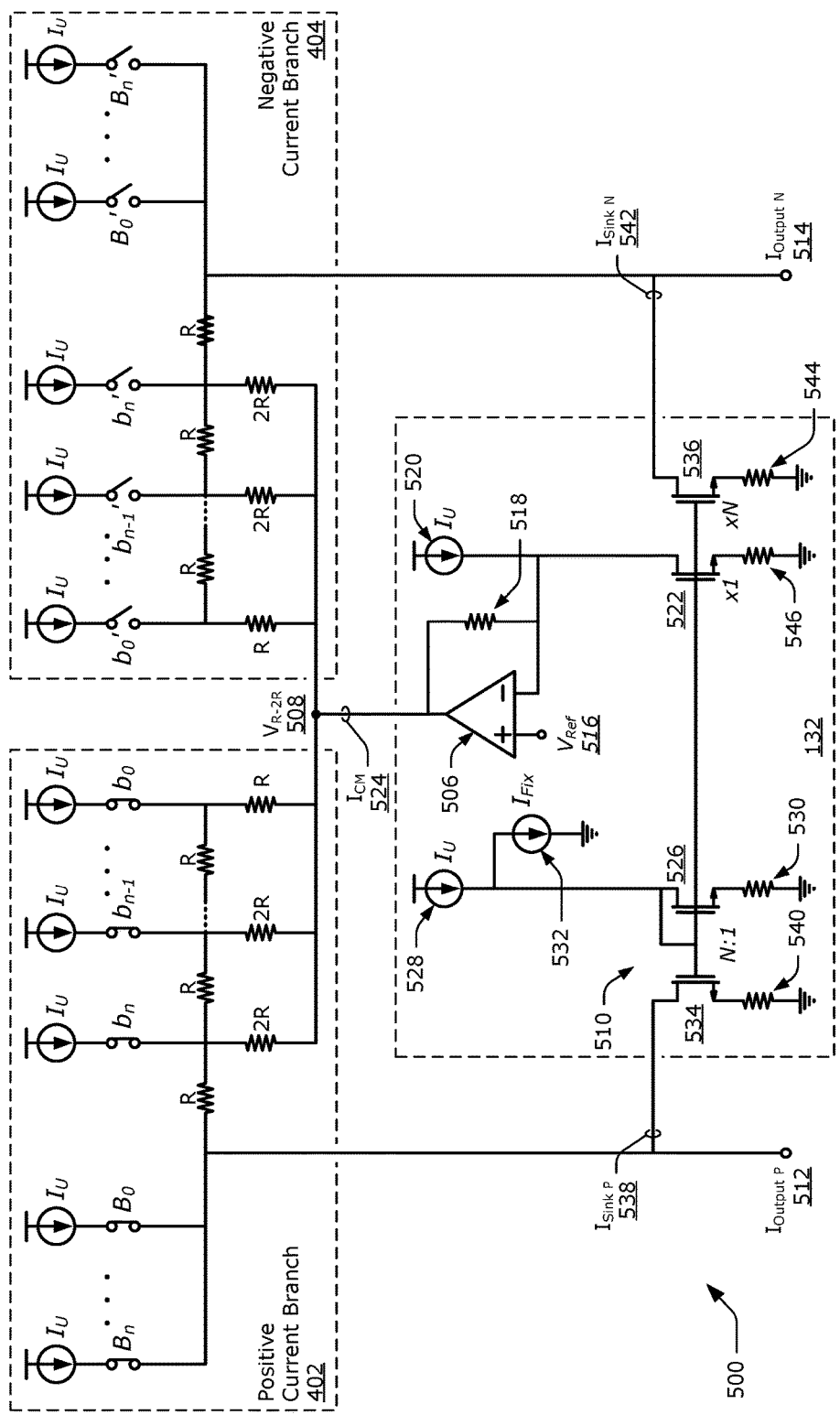
FIG. 5 illustrates an example DAC circuit that includes an amplifier implemented in accordance with one or more aspects.

FIG. 5 illustrates an example DAC circuit 500 that includes current removal circuitry implemented with an amplifier. The DAC circuit 500 may be configured as any suitable type of DAC circuit, such as the DAC circuit 300 described with reference to FIG. 3. For visual brevity, here assume that a positive current branch 502 and negative current branch 504 of the DAC circuit are configured similar to those of the DAC circuit 300 with respective MSB and LSB portions of current steering stages and R-2R resistor networks. As such, a digital input of the DAC circuit 500 can be partitioned into respective MSB and LSB parts, which are then thermo-decoded into bit values $B_0$ through $B_N$ to control the MSB portion and binary-weighted bit values $b_0$ through $b_n$ to control the LSB portion.

In this example, the DAC circuit 500 includes an instance of current removal circuitry 132 that is configured with an amplifier. The current removal circuitry 132 includes an amplifier 506 with an output connected to a common node 508 of the R-2R resistor ladders and a current mirror 510 connected to a positive current output 512 and negative current output 514 of the DAC circuit 500. A positive input of the amplifier 506 is connected to a reference voltage 516 and a resistor 518 is connected from the output to a negative input of the amplifier 506 for feedback. In some cases, using the amplifier 506 to sink current from the DAC circuit 500 can further improve differential noise because $V_{R\text{-}2R}$ at the common node 508 can be lowered. Although shown as implemented with one amplifier (e.g., operational amplifier), the current removal circuitry may be implemented with any suitable number or configuration of amplifiers, current mirrors, current sinks, or current sources.

The negative input of the amplifier 506 is also referenced to a unit current source 520, which may be configured similar to unit current sources or MSB current sources of the DAC circuit 500. An output of the unit current source 520 is also connected to a drain of a transistor 522 of the current mirror 510 of the current removal circuitry 132. As such, the amplifier 506 may be referenced to a difference between the unit amount of current and an amount of current sank or drawn by the transistor 522 of the current mirror 510. Based on the unit amount of current or the current difference at the negative input, the amplifier 506 is configured to sink common mode-current 524 ($I_{CM}$ 524) from the R-2R sections of the DAC circuit 500.

The current mirror 510 includes a gate-drain coupled transistor 526 having a drain connected to a unit current source 528 and a source connected to a lower potential via a resistor 530. The circuitry may also include a current sink 532 (or current source) configured to sink a fixed or variable amount of current ($I_{Fix}$) to a lower potential. This current sink 532 can be connected to the unit current source 528 such that the current mirror 510 is referenced to a difference in current between the unit current source 528 and the current sink 532. Further, when an amount of current sank by the current sink 532 exceeds the unit amount of current, the current mirror 510 may not receive reference current to operate and may cease to operate until the reference current increases (e.g., above $I_{Fix}$).

A pair of transistors 534 and 536 of the current mirror 510 are connected to the positive current output 512 and negative current output 514, respectively. The transistor 534 is configurable to sink an amount of positive sink current 538 ($I_{Sink\ P}$ 538) through a resistor 540 based on current flowing through the gate-drain coupled transistor 526. Similarly, the transistor 536 is also configurable to sink an amount of negative sink current 542 ($I_{Sink\ N}$ 542) through a resistor 544 based on the current flowing through the gate-drain coupled transistor 526. As noted, the transistor 522 is connected to the unit current source 520 and is also configurable to sink current through a resistor 546 based on the current of the gate-drain coupled transistor 526. Although shown with resistors 530, 540, 544, and 546, the DAC circuit 500 can be implemented without any or all of these resistors, which do not affect functionality of the current removal circuitry.

The amplifier 506 and current mirror 510 of the current removal circuitry 132 may be configurable in various ways to sink current from the DAC circuit 500. In some cases, the amplifier 506 and current mirror 510 are configured based on a number of stages, number of current sources, or an amount of current steered by the DAC circuit 500. For example, a value of the resistor 518 can be selected or varied such that the amplifier 506 sinks approximately a multiple of the unit amount of current or current difference at the negative input of the amplifier 506. Alternately or additionally, the transistors 534, 536 of the current mirror 510 can be scaled by varying device size (or number) to sink a multiple (N:1) of the amount of current in the gate-drain coupled transistor 526. Thus, the current removal circuitry 132 can be configured and fabricated for a particular DAC configuration to remove a maximum amount of common-mode current from a common node of the resistor ladders.

In some aspects, reference current for the amplifier 506 or the current mirror 510 may adjust or vary based on operation of the DAC circuit 500. For example, as full scale current or unit amount of current of the DAC circuit 500 varies, the fixed amount of current sank by the current sink 532 can affect the reference current of the current mirror 510. This in turn, via the transistor 522 connected to the negative input of the amplifier 506, may also affect reference current of the amplifier 506. As such, the current removal circuitry 132 may adaptively adjust respective amounts of $I_{CM}$ 524, $I_{Sink\ P}$ 538, and $I_{Sink\ N}$ 542 sank from the DAC circuit 500.

The adaptive adjustment of these respective currents may enable, under various voltage headroom limitations, maximum current to be sank from the middle point of the R-2R ladders.

Figure 6:
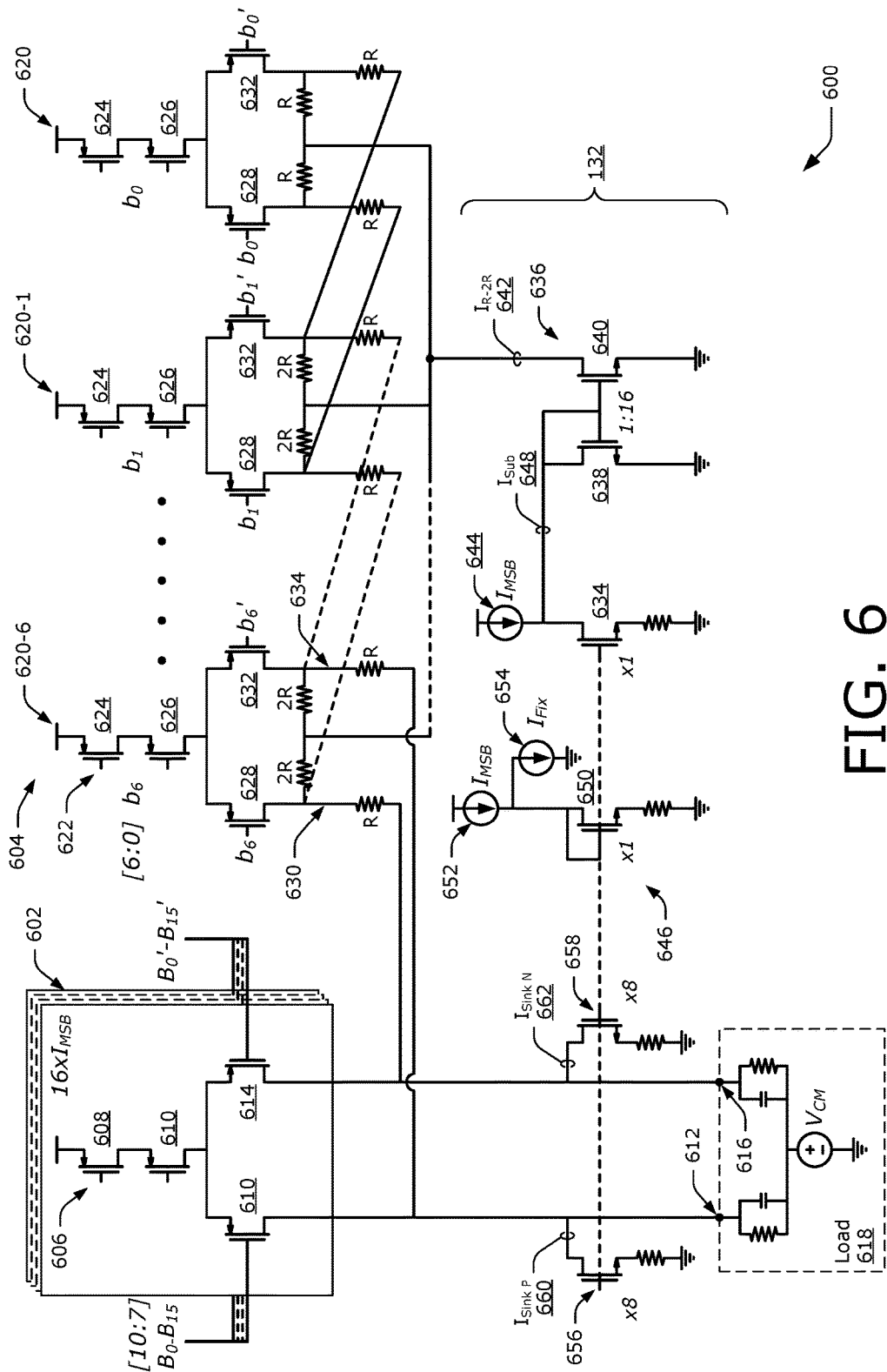
FIG. 6 illustrates an example of a segmented DAC with current mirror circuitry configured for common-mode current removal.

FIG. 6 illustrates an example of a segmented DAC 600 (DAC 600) with a current removal circuitry configured with current mirrors. A segmented DAC may be implemented to convert a digital input of any suitable size to an analog output. In this example the DAC 600 is implemented as a 11-bit DAC with an MSB portion 602 to convert four MSB inputs (e.g., [10:7]), and a LSB portion 604 to convert 7 LSB inputs (e.g., [6:0]). With reference to the current sources and switches of the MSB portion 602 and LSB portion 604 of the DAC 600, these elements are shown as individual components that may represent similar elements of other figures of this disclosure. Further, although shown as being implemented with P-channel and N-channel metal-oxide-semiconductor field-effect transistors (P-FETs or N-FETs) and various current sources, the circuits or aspects described herein may also be implemented as other components or topologies, such as bipolar junction transistors (BJTs) or a circuit implemented with reversed power rails, inverted control signals, current sinks, or complimentary transistor types.

The MSB portion 602 of the DAC includes 16 parallel stages configured to steer current based on a fully decoded set of MSB inputs (e.g., $B_0$-$B_{15}$). Each stage of the MSB portion 602 includes a current source 606 formed by two cascode P-FETs 608, 610 that provide an MSB unit of current ($I_{MSB}$). Current of each MSB stage is steered, based on an MSB input bit ($B_N$), by a P-FET 610 to a positive output 612 of the DAC 600 or by a P-FET 614 to a negative output 616 of the DAC 600. As such, the MSB portion steers approximately 16 times $I_{MSB}$ to a differential load 618 connected to the outputs 612, 616 of the DAC 600.

In this particular example, the LSB portion 604 of the DAC 600 includes seven LSB stages 620 through 620-6. With reference to LSB stage 620-6, each LSB stage includes a current source 622 formed by two cascode P-FETs 624, 626 that provide an MSB unit of current ($I_{MSB}$). Current of each LSB stage is steered, based on an LSB input bit ($b_N$), by a P-FET 628 into a first R-2R section 630 connected to the positive output 612 or by P-FET 632 to a second R-2R ladder section 634 connected to the negative output 616. As such, the LSB portion 604 steers approximately one $I_{MSB}$ to the differential load 618 connected to the outputs 612, 616 of the DAC 600.

The DAC 600 also includes an instance of current removal circuitry 132 configured with current mirrors. In alternate implementations, a DAC 600 may include an amplifier to remove or sink common-mode current. With reference to FIG. 6, a first current mirror 636 is formed from N-FETs 638 and 640, which are configured with a 1:16 ratio. By so doing, the current mirror 636 sinks approximately 16 times an amount of current flowing through N-FET 638. A drain of the N-FET 640 is connected to a common node of the R-2R sections, from which the first current mirror 636 is configured to sink current 642 from the common node of the R-2R sections (IR-2R 642). The first current mirror 636 can sink an amount of current based on a ratio of N-FETs 638, 640 and a difference in current provided by a unit current source 644 (e.g., $I_{MSB}$) and current sank by a second current mirror 646 (e.g., $I_{MSB}$-$I_{Fix}$). This difference in current may also be referred to a sub-difference amount of current or $I_{Sub}$ 648.

The second current mirror 646 includes a gate-drain coupled N-FET 650 with a drain connected to a unit current source 652 and a current sink 654 configured to sink a fixed amount of current. As such, the second current mirror 646 may be referenced to a difference in current between the unit current source 652 and the current sink 654. The fixed amount of current may be set to any suitable amount of current, such as a fraction (e.g., one half) or multiple of the unit amount of current or a full scale current of the DAC 600. For example, the fixed amount of current sank by the current sink 654 may vary from approximately one half of $I_{MSB}$, the same as $I_{MSB}$, or twice $I_{MSB}$ depending on full scale current of the DAC 600.

A pair of N-FETs 656 and 658 of the second current mirror 646 are connected to the positive output 612 and negative output 616 of the DAC 600, respectively. The N-FETs 656 and 658 are configurable to sink respective amounts of positive sink current 660 ($I_{Sink\_P}$ 660) and negative sink current 662 ($I_{Sink\_N}$ 662) from the differential outputs of the DAC 600. In this particular example, the N-FETs 656 and 658 are configured to sink approximately 8 times an amount of current flowing through the N-FET 650 of the second current mirror.

In some aspects, reference current of the first current mirror 636 or the second current mirror 646 may adjust or vary based on operation of the DAC 600. By so doing, the current removal circuitry 132 may adaptively alter or change respective amounts of $I_{R-2R}$ 642 (e.g., $I_{CM}$), $I_{Sink\_P}$ 660, and $I_{Sink\_N}$ 662 that are sank from the DAC 600. As such, various implementations of the current removal circuitry 132 can adaptively sink, over a wide range of currents scales, various amounts of current from a common node of the R-2R ladders and differential outputs to minimize common-mode current on the output of the DAC.

Techniques of Current Removal for Digital-to-Analog Converters

The following techniques of current removal for digital-to-analog converters (DACs) may be implemented using any elements of the example environment, components, or circuits described herein. Reference to elements, such as the DAC 130 or current removal circuitry 132, is made by example only and is not intended to limit the ways in which the techniques can be implemented.

The techniques are described with reference to example methods illustrated in FIGS. 7-9, which are depicted as respective sets of operations or acts that may be performed by entities described herein. The operations described herein may be performed using any suitable circuitry or component, which may provide means for implementing one or more of the operations. The depicted sets of operations illustrate a few of the many ways in which techniques of current removal for digital-to-analog converters may be implemented. As such, operations of a method may be repeated, combined, separated, omitted, performed in alternate orders, performed concurrently, or used in conjunction with another method or operations thereof.

Figure 7:
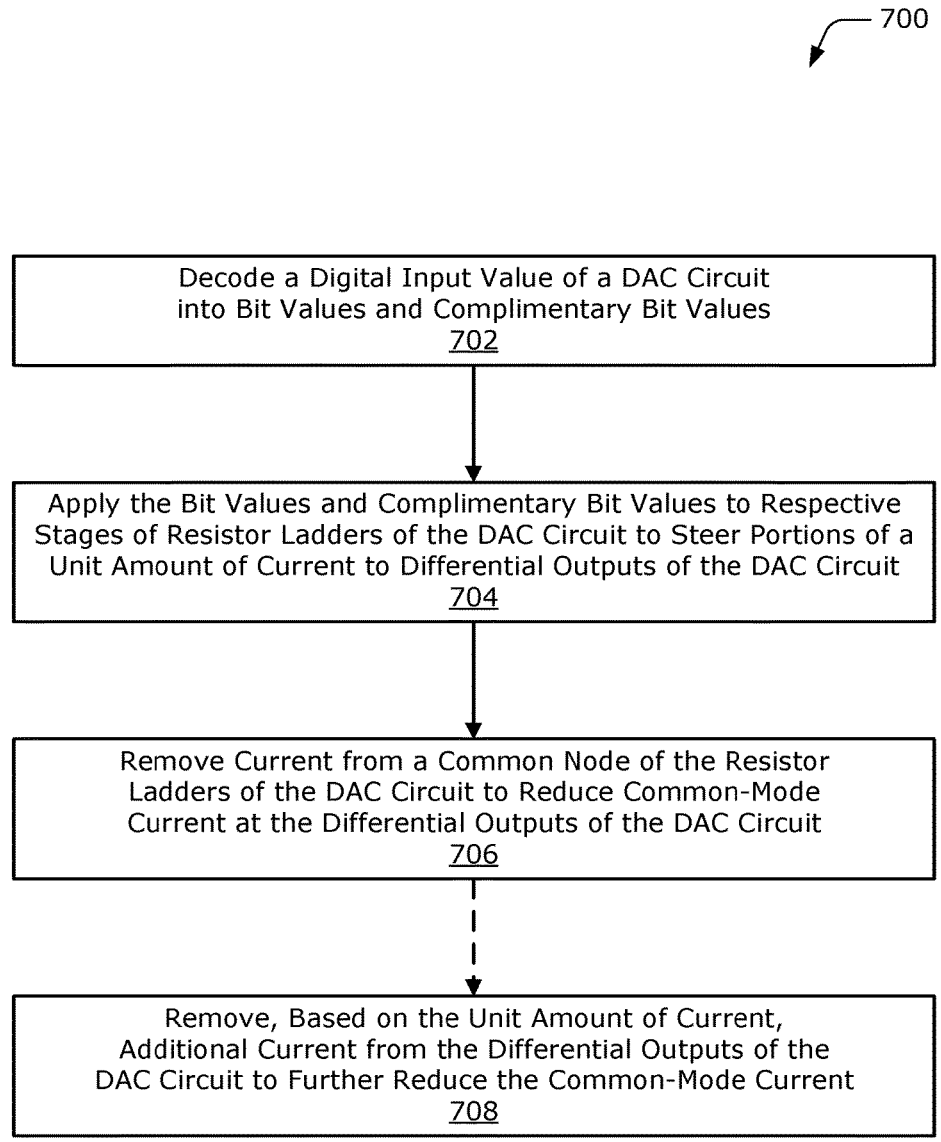
FIG. 7 illustrates an example method for removing common-mode current from a common node of a DAC circuit.

FIG. 7 illustrates an example method 700 for removing current from a digital-to-analog converter, including operations performed by the current removal circuitry 132.

At 702, a digital input value is decoded into bit values and complimentary bit values. The digital input value may be of any suitable size or format, such as an 8-bit digital value to 20-bit digital value. In some cases, a decoding circuit divides or splits the digital input value into an MSB portion of bits and an LSB portion of bits based on a configuration of a DAC circuit. By way of example, consider the DAC 600 of FIG. 6 which is configured as an 11-bit DAC with a four bit MSB portion and an seven bit LSB portion. Provided with a 11-bit digital input value, a decoding circuit for DAC 600 thermo-decodes four MSB bits of the input value to steer 16 MSB current stages and directly decodes seven LSB bits of the input value to steer 7 LSB current stages.

At 704, the bit values and complimentary bit values are applied to respective stages of a segmented or resistor ladder DAC circuit. This can be effective to steer corresponding unit amounts of current to outputs of the DAC circuit (e.g., MSB bits) or into the resistor ladder of the DAC circuit (e.g., LSB bits). In the context of the present example, each fully decoded MSB bit steers a unit of $I_{MSB}$ of an MSB stage to the positive output 612 or negative output 616 of the DAC 600. Similarly, each LSB bit steers a unit of $I_{MSB}$ into one of the first R-2R section 630 or second R-2R section 634, which scale or weight an $I_{MSB}$ contribution from each bit to the outputs based on a respective stage's position in the resistor ladder.

At 706, current is removed from a common node of the resistor ladders of the DAC circuit to reduce common-mode current at a differential output of the DAC circuit. An amount of the current can removed based on a unit amount of current provided by or to a stage of the DAC circuit. In some cases, current removal circuitry removes a multiple of the unit amount of current based on a number of MSB stages of a DAC circuit. Alternately or additionally, the amount of current removed can be based on a difference between the unit amount of current and a fixed or referenced amount of current.

Continuing the ongoing example, assume that the DAC 600 is operating with a full scale current of approximately 5 milliamps and an $I_{MSB}$ of approximately 312 microamps. Here, $I_{Fix}$ can be set to approximately 156 microamps, or one half of $I_{MSB}$, such that the current removal circuitry 132 sinks approximately 8 times $I_{MSB}$ from the common node of the resistor sections 630, 634 of the DAC. Thus, the current removal circuitry 132 reduces common-mode current on the differential outputs 612, 616 of the DAC by approximately 2.5 milliamps.

Optionally at 708, current is removed from differential outputs of the DAC circuit based on the unit amount of current. This can be effective to further reduce the common-mode current on the differential outputs in addition to the current removed from the common node. An amount of current removed from the differential outputs can be based on a difference between unit amount of current steered by an MSB stage of the DAC and a reference or fixed amount of current. In such cases, the amount of current removed from the differential outputs may change or decrease to zero responsive to a change in full scale current of the DAC circuit.

Concluding the present example, the current removal circuitry 132 removes approximately four times $I_{MSB}$ or 1.25 milliamps from the positive output 612 and negative output 616 of the DAC 600. By so doing, the common-mode current on the differential outputs 612, 616 of the DAC 600 is reduced to approximately three and one half times $I_{MSB}$ or 1.09 milliamps. In some implementations, the techniques of current removal described herein can result in a 40% to 50% improvement in differential noise levels over conventional methods of correcting common-mode current.

As another example, consider Table 1 in which differential noise improvement provided by aspects of current removal is contrasted with noise performance of a conventional DAC. In Table 1, the noise figures are normalized to DAC core noise that includes the noise of MSB and LSB current sources.

TABLE 1

Normalized DAC Noise Figures

| | | Full Scale Current | | |
|---|---|---|---|---|
| | | $I_{FS}$ | $I_{FS}/2$ | $I_{FS}/4$ |
| Conventional DAC | RMS Noise of DAC Core | 1 | 0.84 | 0.7 |
| | RMS Differential Noise from Output Current Sinks | 1 | 0.84 | 0.7 |
| | Total RMS Differential Output Noise | 1.4 | 1.18 | 1 |
| DAC Implemented with Current Removal | RMS Noise of DAC Core | 1 | 0.84 | 0.7 |
| | RMS Differential Noise from Output Current Sinks | 0.5 | 0 | 0 |
| | Total RMS Differential Output Noise | 1.12 | 0.84 | 0.7 |

As shown in Table 1, aspects of current removal for DACs can reduce RMS differential output noise by approximately 25% to 30% over various ranges of full scale current. Additionally, note that for full scale current of $I_{FS}/2$ or $I_{FS}/4$, that the techniques can sink most or all of the common-mode current from the common node (e.g., R-2R node) of the resistor networks such that there is no differential noise contribution from the differential current sinks proximate an output of the DAC. Thus, these and other aspects of current removal for DACs can reduce or eliminate common-mode current at the outputs of a DAC without degrading the DAC's differential noise performance.

Figure 8:
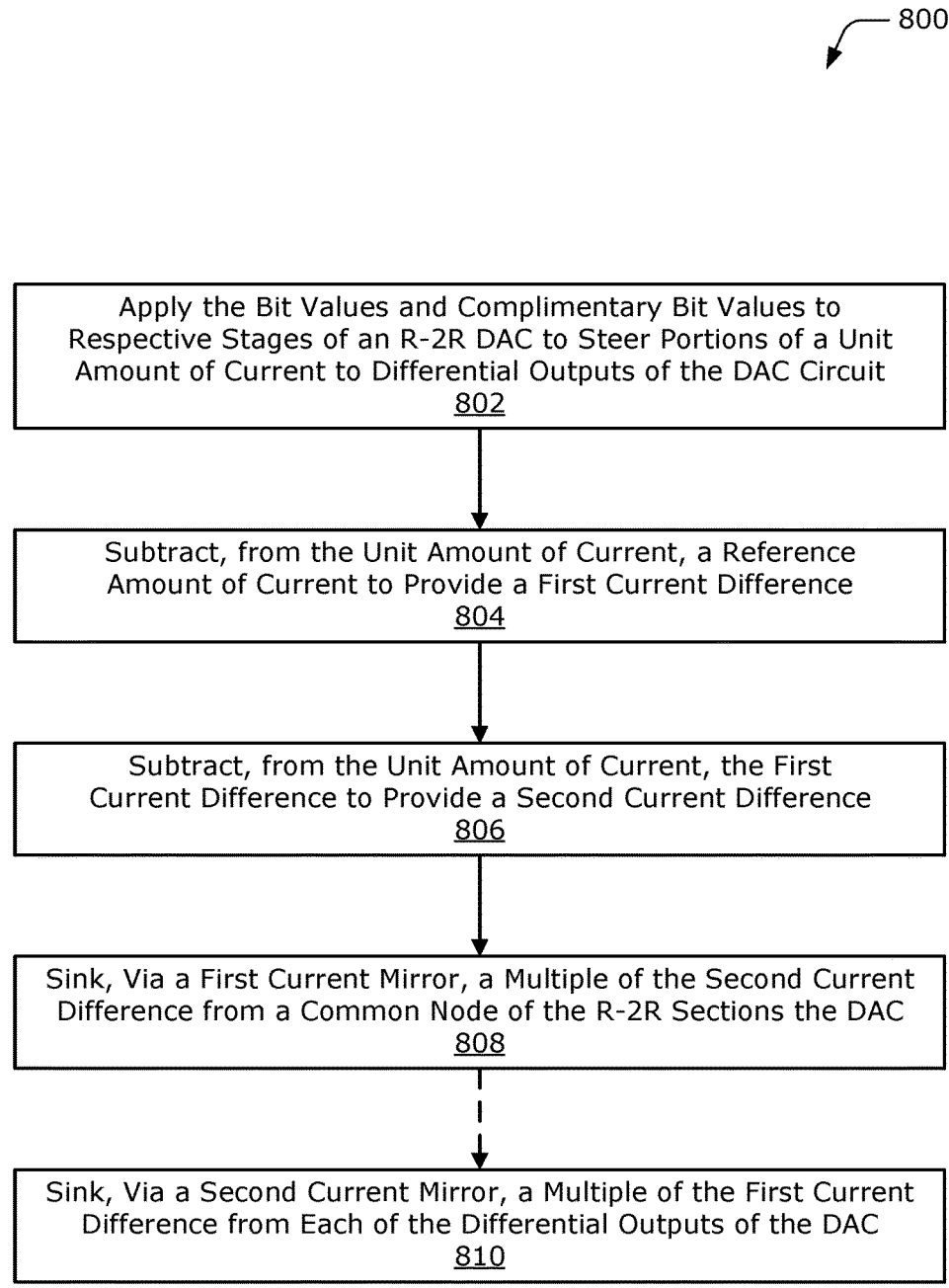
FIG. 8 illustrates an example method for sinking common-mode current of a DAC with a current mirror.

FIG. 8 illustrates an example method 800 for an example method for sinking common-mode current with a current mirror, including operations performed by the current removal circuitry 132.

At 802, the bit values and complimentary bit values are applied to respective stages of an R-2R DAC to steer unit amounts of current through respective R-2R ladders of the DAC. Each respective stage can contribute a portion of the unit amount of current to a differential output of the DAC based on the stage's relative position or order in the R-2R resistor ladder. For example, a most significant LSB stage may contribute one half of the unit amount of current to one output and a least significant LSB stage may contribute a $\frac{1}{128}^{th}$ of the unit amount of current to another output.

At 804, a reference amount of current is subtracted from the unit amount of current to provide a first current difference. The reference amount of current may be set or predefined based on any suitable amount of current, such as the unit amount of current steered by an MSB stage of the DAC, full scale current of the DAC, or a combination thereof. In some cases, the reference amount of current is fixed or set during manufacture of the DAC. In other cases, the reference amount of current is adjusted based on settings (e.g., full scale current) of the DAC. The first current difference may provide an input or reference current for a first current mirror or current sink of current removal circuitry.

At 806, the first current difference is subtracted from the unit amount of current to provide a second current difference. The second current difference may range from approximately zero amps up to a unit amount of current. In some cases, the first and second current differences are useful to adaptively sink current from a common node of the R-2R ladders or differential outputs of the DAC. For example, the second current difference may be used as an input or reference current for a second current mirror or current sink of current removal circuitry of the DAC.

At 808, a multiple of the second current difference is sank from a common node of the R-2R sections of the DAC by the second current mirror of current removal circuitry. By removing this current from the common node of the DAC, common-mode current on the outputs of the DAC can be reduced without degrading differential signal performance of the DAC. In some cases, an amount of the current sank from the common node varies as the second current difference due to changes in full scale current or the unit amount of current. Thus, the second current mirror may adaptively sink current from the common node of the R-2R sections to remove the common-mode current from the DAC differential outputs.

Optionally at 810, a multiple of the first current difference is sank from each of the differential outputs of the DAC by the first current mirror. This can be effective to further reduce common-mode current on the outputs of the DAC. In some cases, the amount of current removed from the differential outputs of the DAC varies as the first current difference changes due to changes in full scale current or the unit amount of current from which the reference current is subtracted. As such, the first current mirror can adaptively sink current from the differential outputs of the DAC over a wide range of operating conditions.

Figure 9:
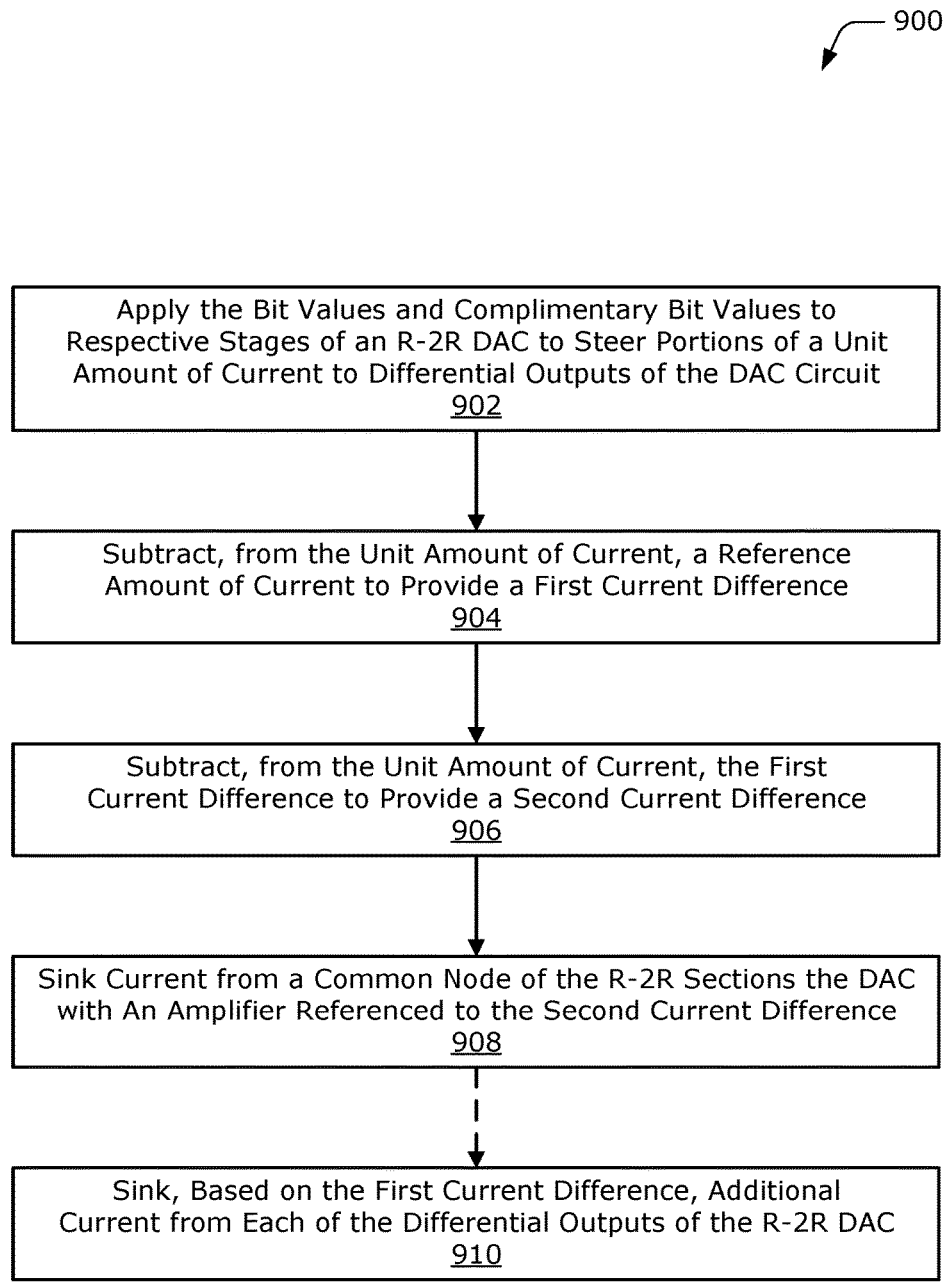
FIG. 9 illustrates an example method for sinking common-mode current of a DAC with an amplifier.

FIG. 9 illustrates an example method 900 for an example method for sinking common-mode current with an amplifier, including operations performed by the current removal circuitry 132.

At 902, the bit values and complimentary bit values are applied to respective stages of an R-2R DAC to steer unit amounts of current through respective R-2R ladders of the DAC. Each respective stage can contribute a fraction of the unit amount of current to a differential output of the DAC based on the stage's relative position or order in the R-2R resistor ladder. For example, a most significant LSB stage may contribute one half of the unit amount of current to one output and a least significant LSB stage may contribute a $\frac{1}{128}^{th}$ of the unit amount of current to another output.

At 904, a fixed amount of current is subtracted from the unit amount of current to provide a first current difference. The reference amount of current may be set or predefined based on any suitable amount of current, such as the unit amount of current steered by an LSB stage of the DAC, full scale current of the DAC, or a combination thereof. In some cases, the reference amount of current is fixed or set during manufacture of the DAC. In other cases, the reference amount of current is adjusted based on current settings (e.g., unit amount of current) of the DAC. The first current difference may provide an input or reference current for a current mirror or current sink of current removal circuitry.

At 906, the first current difference is subtracted from the unit amount of current to provide a second current difference. The second current difference may range from approximately zero amps up to a unit amount of current. In some cases, the first and second current differences are useful to adaptively sink current from a common node of the R-2R ladders or differential outputs of the DAC. For example, the second current difference may be used as an input or reference current for an amplifier of current removal circuitry of the DAC.

At 908, current is sank from a common node of the R-2R sections of the DAC with an amplifier that is referenced to the second current difference. This can be effective to reduce common-mode current on the outputs of the DAC without degrading differential signal performance of the DAC. In some cases, an amount of the current sank from the common node varies as the second current difference due to changes in full scale current or the unit amount of current. Thus, the amplifier may adaptively sink current from the common node of the R-2R sections to remove the common-mode current from the DAC differential outputs.

Optionally at 910, additional current is sank from each differential output of the R-2R DAC based on the first current difference. This can be effective to further reduce common-mode current on the outputs of the DAC. In some cases, the amount of current sank from the differential outputs of the DAC varies as the first current difference changes due to changes in full scale current or the unit amount of current from which the reference current is subtracted. As such, the second current mirror can adaptively sink current from the differential outputs of the DAC over a wide range of operating conditions.

System-on-Chip

Figure 10:
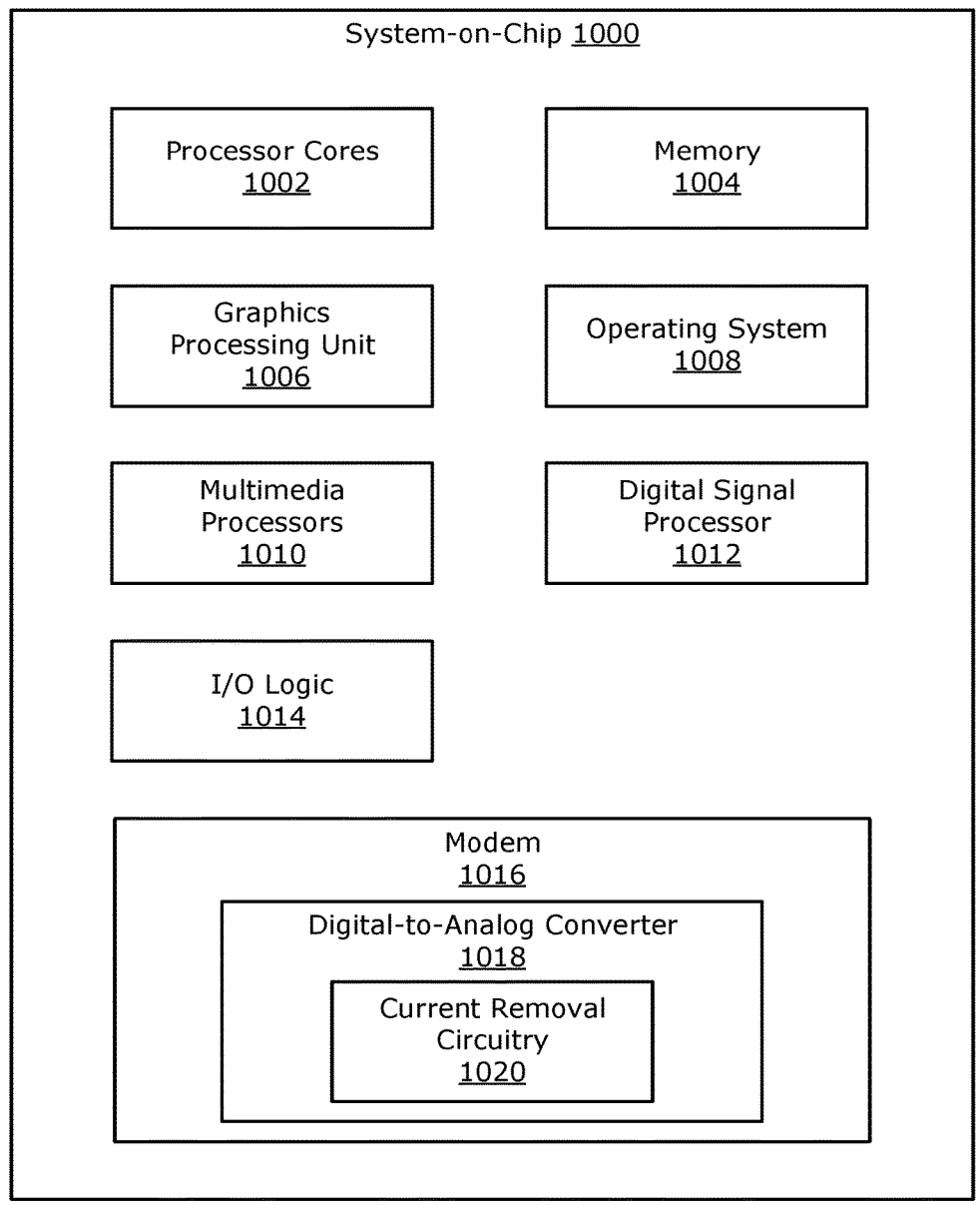
FIG. 10 illustrates an example system-on-chip that includes a digital-to-analog converter with current removal circuitry.

FIG. 10 illustrates an example system-on-chip 1000, which includes components capable of implementing aspects of current removal for DACs. The system-on-chip 1000 may be implemented as, or in, any suitable electronic device, such as a modem, broadband router, access point, cellular phone, smart-phone, gaming device, set-top box, laptop computer, net book, smart-phone, network-attached storage (NAS) device, or any other device that may implement current removal for DACs.

The system-on-chip 1000 may be integrated with, a microprocessor, storage media, I/O logic, data interfaces, logic gates, a transmitter, a receiver, circuitry, firmware, software, or combinations thereof to provide communicative or processing functionalities. The system-on-chip 1000 may include a data bus (e.g., cross bar or interconnect fabric) enabling communication between the various components of the system-on-chip. In some aspects, components of the system-on-chip 1000 may interact with other communication components (e.g., RF transceiver) to implement aspects of current removal for DACs.

In this particular example, the system-on-chip 1000 includes processor cores 1002, memory 1004, and graphics processing unit 1006. The processor cores 1002 may be configured as any suitable type of processer, such as an application processor. The memory 1004 may include any suitable type of memory, such as volatile memory (e.g., DRAM), static RAM (SRAM), non-volatile memory (e.g., Flash), and the like. The memory 1004 or other caches of the system-on-chip 1000 are implemented as a storage medium, and thus do not include transitory propagating signals or carrier waves. The memory 1004 can store data and processor-executable instructions of system-on-chip 1000, such as an operating system 1008, firmware, boot code, or other applications. The processor cores 1002 execute operating system 1008 (or firmware) and other applications from the memory 1004 to implement functions of the system-on-chip 1000.

The GPU 1006 of the system-on-chip 1000 renders graphical content associated with the operating system 1008 and applications to provide various user interfaces or visual graphics. The system-on-chip 1000 may also include multimedia processors 1010 for encoding or decoding multimedia content, such as video streams or video files. Alternately or additionally, the system-on-chip 1000 can implement a digital signal processor 1012 to process signals and input from sensors associated with the system-on-chip.

The system-on-chip 1000 may also include I/O logic 1014, which can be configured to provide a variety of I/O ports or data interfaces for inter-chip or off-chip communication. These data interfaces may include any suitable type of interface, such as an interface to a host device or other peripherals components. Wireless communication of the system-on-chip 1000 is enabled by a modem 1016, which may be configured as a multi-mode and/or multi-band modem to communicate in accordance with multiple communication standards, protocols, or specifications.

The modem 1016 of the system-on-chip 1000 includes a digital-to-analog converter 1018 and current removal circuitry 1020, which may be implemented as described with reference to FIGS. 1-9. For example, the DAC 1018 and current removal circuitry 1020 may be implemented in a modem, transceiver, transmit chain, or other component configured to enable wireless or wired communication.

The DAC 1018 may convert any suitable type of input data, such as modulated baseband information to analog signals prior to up-conversion by a transceiver or transmit chain. As described herein, the current removal circuitry 1020 may remove current from a common node of resistor section of the DAC 1028 to reduce common-mode current at differential outputs of the DAC. By so doing, the common-mode current can be reduced with minimal degradation to differential noise performance of the DAC 1018.

In some aspects, the current removal circuitry 1020 may also remove additional current from the differential outputs of the DAC 1018 to further reduce common-mode current on the differential outputs of the DAC. The DAC 1018, current removal circuitry 1020, and other components of system-on-chip 1000 may be implemented as hardware, fixed-logic circuitry, firmware, or a combination thereof that is implemented in association with I/O logic 1014 or other signal processing circuitry of system-on-chip 1000.

Although subject matter has been described in language specific to structural features or methodological operations, it is to be understood that the subject matter defined in the appended claims is not necessarily limited to the specific features or operations described herein, including not necessarily being limited to the organizations in which features are arranged or the orders in which operations are performed.

What is claimed is:

1. A circuit for converting a digital input to an analog output, the circuit comprising:
   a first resistor ladder that includes first resistors with first terminals connectable to respective current sources and second terminals connected together, the first resistor ladder connected to a first output of the circuit;
   a second resistor ladder that includes second resistors with first terminals connectable to the respective current sources and second terminals connected together, the second resistor ladder connected to a second output of the circuit;
   a common node formed between the second terminals of the first resistors and second terminals of the second resistors; and
   a current sink connected between the common node of the circuit and a lower potential.

2. The circuit as recited in claim 1, wherein the first resistor ladder or the second resistor ladder is implemented as a resistor two-resistor (R-2R) resistor ladder that includes resistors of at least two different values.

3. The circuit as recited in claim 1, wherein the respective current sources are first respective current sources, the circuit further comprises a second current source, and the current sink is referenced to the second current source of the circuit.

4. The circuit as recited in claim 3, wherein the second current source is configured to provide approximately an amount of current that is provided by one of the first respective current sources.

5. The circuit as recited in claim 3, wherein the current sink comprises a first current mirror referenced to the second current source and the circuit further comprises a second current mirror that is configured to sink current from the second current source to which the first current mirror is referenced.

6. The circuit as recited in claim 5, further comprising a third current source and a second current sink, and wherein the second current mirror is referenced to a difference of current provided by the third current source and current sank by the second current sink.

7. The circuit as recited in claim 6, wherein an amount of current provided by the third current source is variable and an amount of current sank by the second current sink is fixed.

8. The circuit as recited in claim 6, wherein the second current mirror is further configured to sink additional current from the first output or the second output of the circuit.

9. The circuit as recited in claim 8, wherein an amount of the current that the second current mirror is configured to sink from the second current source is different from an amount of the additional current that the second current mirror is configured to sink from the first output or the second output of the circuit.

10. A circuit for converting a digital input to an analog output, the circuit comprising:
a first resistor ladder that includes first resistors with first terminals connectable to first respective current sources and second terminals connected together, the first resistor ladder connected to a first output of the circuit;
a second resistor ladder that includes second resistors with first terminals connectable to the first respective current sources and second terminals connected together, the second resistor ladder connected to a second output of the circuit;
a common node formed between the second terminals of the first resistors and second terminals of the second resistors; and
an amplifier having an output connected to the common node of the circuit and an input connected to a second current source that provides current to a lower potential.

11. The circuit as recited in claim 10, wherein the input of the amplifier is a negative input, the amplifier includes a positive input that is connected to a reference voltage, and the circuit further comprises a resistor connected from the output of the amplifier to the negative input of the amplifier.

12. The circuit as recited in claim 10, wherein the amplifier is implemented to sink current from the common node of the circuit based on an amount of current provided by the second current source.

13. The circuit as recited in claim 10, wherein the second current source is configured to provide an amount of current that approximates an amount of current provided by one of the first respective current sources.

14. The circuit as recited in claim 10, wherein the first resistor ladder or the second resistor ladder is implemented as a resistor two-resistor (R-2R) resistor ladder that includes resistors of at least two different values.

15. The circuit as recited in claim 14, wherein:
the first resistors are connectable to the first respective current sources via first switches that are individually controllable to drive current through respective stages of the first R-2R resistor ladder; or
the second resistors are connectable to the first respective current sources via second switches that are individually controllable to drive other current through respective stages of the second R-2R resistor ladder.

16. The circuit as recited in claim 10, further comprising:
a third current source;
a current sink; and
a current mirror that is:
referenced to a difference of an amount of current provided by the third current source and an amount of current sank by the current sink; and
configured to sink, based on the difference, current from the second current source to which the amplifier is connected.

17. The circuit as recited in claim 16, wherein the amount of current provided by the third current source is variable and the amount of current sank by the current sink is fixed.

18. The circuit as recited in claim 16, wherein the current mirror is further configured to sink, based on the difference, additional current from the first output or the second output of the circuit.

19. A digital-to-analog converter (DAC) for converting a digital value to an analog signal, the DAC comprising:
first stages that each include a current source, a first switch connected from the current source to a first output of the DAC, and a second switch connected from the current source to a second output of the DAC;
second stages that each include a current source, a first switch connected from the current source to two resistors of a first resistor ladder that is connected to the first output, and a second switch connected from the current source to two resistors of a second resistor ladder that is connected to the second output;
a common node formed between common terminals of the resistors of the first resistor ladder and common terminals of the resistors of the second resistor ladder;
another current source configured to provide current to a lower potential; and
a current mirror connected between the common node of the DAC and the lower potential, the current mirror referenced to the other current source of the DAC.

20. The DAC as recited in claim 19, wherein the current mirror comprises:
a common-source transistor having a drain connected to the common node and a source connected to the lower potential; and
a gate-drain coupled transistor having a drain connected to the other current source, a gate connected to a gate of the common-source transistor, and a source connected to the lower potential.

21. The DAC as recited in claim 19, wherein the current sources of the stages are first current sources, the other current source is a second current source, the current mirror is a first current mirror, and the DAC further comprises a second current mirror that includes:
a gate-drain coupled transistor having a drain connected to a third current source and a source connected to the lower potential;
a transistor having a drain connected to the second current source, a gate connected to a gate of the gate-drain coupled transistor, and a source connected to the lower potential.

22. The DAC as recited in claim 21, further comprising a current sink connected to a node formed between the third current source and the drain of the gate-drain coupled transistor of the second current mirror.

23. The DAC as recited in claim 21, wherein the transistor of the second current mirror is a first transistor and the second current mirror further comprises:
   a second transistor having a drain connected to the first output of the circuit, a gate connected to the gate of the gate-drain coupled transistor, and a source connected to the lower potential; and
   a third transistor having a drain connected to the second output of the circuit, a gate connected to the gate of the gate-drain coupled transistor, and a source connected to the lower potential.

24. The DAC as recited in claim 19, wherein the current mirror is configured to sink current from the common node of the DAC based on an amount of current provided by the first stages of the DAC or a number of the first stages of the DAC.

25. The DAC as recited in claim 19, wherein the DAC is implemented as a segmented DAC, the first stages are configured as most significant bit (MSB) stages controlled by thermometer-decoded bits and complimentary bits of a first portion of the digital value, and the second stages are configured as least significant bit (LSB) stages controlled by binary-decoded bits and complimentary bits of a second portion of the digital value.

26. The DAC as recited in claim 19, wherein the DAC is embodied in one of a system-on-chip, wired transceiver, wireless transceiver, modem baseband, or wireless communication interface.

27. A digital-to-analog conversion (DAC) circuit, the DAC circuit comprising:
   means decoding a digital input of the DAC circuit into bit values and complimentary bit values;
   means for applying the bit values and complimentary bit values to respective stages of resistor ladders to steer portions of a unit amount of current to differential outputs of the DAC circuit; and
   means for removing, based on the unit amount of current, current from a common node of the resistor ladders to reduce common mode current at the differential outputs of the DAC circuit.

28. The DAC circuit as recited in claim 27, further comprising means for removing, based on the unit amount of current, additional current from the differential outputs of the DAC circuit.

29. The DAC circuit as recited in claim 27, wherein the means for removing current comprise a current sink or current mirror referenced to the unit amount of current.

30. The DAC circuit as recited in claim 27, wherein the means for removing the current comprise an amplifier with resistor feedback that is referenced to the unit amount of current.

\* \* \* \* \*